(12) United States Patent
Iou et al.

(10) Patent No.: US 10,772,212 B1
(45) Date of Patent: Sep. 8, 2020

(54) ELECTROCHEMICAL OR CHEMICAL TREATMENT DEVICE FOR HIGH ASPECT RATIO CIRCUIT BOARD WITH THROUGH HOLE

(71) Applicant: U-PRO MACHINES CO., LTD., Taoyuan (TW)

(72) Inventors: Hsin-Chi Iou, Taoyuan (TW); Chieh-Yuan Cheng, Taoyuan (TW)

(73) Assignee: U-Pro Machines Co., Ltd., Taoyuan (TW)

(*) Notice: Subject to any disclaimer, the term of this patent is extended or adjusted under 35 U.S.C. 154(b) by 0 days.

(21) Appl. No.: 16/713,636

(22) Filed: Dec. 13, 2019

(51) Int. Cl.
```
H05K 3/00      (2006.01)
H05K 3/08      (2006.01)
H05K 3/24      (2006.01)
C25D 5/00      (2006.01)
C25D 5/02      (2006.01)
C25D 5/08      (2006.01)
C25D 17/00     (2006.01)
C25D 17/02     (2006.01)
C25D 17/12     (2006.01)
H05K 3/18      (2006.01)
C25D 17/08     (2006.01)
```

(52) U.S. Cl.
CPC .............. *H05K 3/188* (2013.01); *C25D 5/08* (2013.01); *C25D 17/08* (2013.01)

(58) Field of Classification Search
CPC .. H05K 3/00; H05K 3/08; H05K 3/24; H05K 3/188; C25D 5/00; C25D 5/02; C25D 5/08; C25D 17/00; C25D 17/02; C25D 17/12

USPC ..... 174/262; 204/193, 230.7, 237, 242, 273; 205/88, 143, 148, 157, 292, 297; 118/70, 118/315, 400, 421, 428, 696, 708, 730; 427/8, 123, 328
See application file for complete search history.

(56) References Cited

U.S. PATENT DOCUMENTS

| | | | |
|---|---|---|---|
| 4,622,917 A * | 11/1986 | Schramm | C23C 18/1616 118/315 |
| 4,687,554 A * | 8/1987 | Shyu | H05K 3/241 205/148 |
| 4,773,983 A * | 9/1988 | Shyu | C25D 5/08 204/237 |
| 4,933,049 A * | 6/1990 | Murphy | C25D 5/026 118/428 |
| 6,544,585 B1 * | 4/2003 | Kuriyama | H01L 21/6715 216/18 |

(Continued)

*Primary Examiner* — Xiaoliang Chen
(74) *Attorney, Agent, or Firm* — Rosenberg, Klein & Lee

(57) ABSTRACT

The present invention relates to an electrochemical or chemical treatment device for high aspect ratio circuit board with through hole comprises: an electroplating tank; a solution storage tank; a positioning frame, the positioning frame fixes the circuit board inside the electroplating tank for the electroplating tank to be divided into a solution accumulated area and a suction area by the positioning frame and the circuit board; a priming piping sucking solution from the solution storage tank to the solution accumulated area; a suction cap corresponding to the suction area; and a suction piping connected to the suction cap, using the negative pressure produced by suction to make the solution flow through the through hole of the circuit board, and further having a better result of electroplating the bore of through hole of the high aspect ratio circuit board.

3 Claims, 7 Drawing Sheets

(56) References Cited

U.S. PATENT DOCUMENTS

| | | | | |
|---|---|---|---|---|
| 2002/0006876 A1* | 1/2002 | Hongo | ................. | B24B 37/345 |
| | | | | 156/345.12 |
| 2002/0063097 A1* | 5/2002 | Fukunaga | ............... | C25D 21/12 |
| | | | | 210/656 |
| 2003/0029717 A1* | 2/2003 | Schroder | .............. | H05K 3/0088 |
| | | | | 204/193 |
| 2003/0092261 A1* | 5/2003 | Kondo | ................. | B24B 37/005 |
| | | | | 438/638 |
| 2003/0106802 A1* | 6/2003 | Hagiwara | ................ | C25D 3/38 |
| | | | | 205/297 |
| 2004/0231997 A1* | 11/2004 | Wang | ................. | C23C 18/1628 |
| | | | | 205/143 |
| 2004/0234696 A1* | 11/2004 | Hongo | ............... | C23C 18/1619 |
| | | | | 427/328 |
| 2009/0095618 A1* | 4/2009 | Makino | ................. | C25D 17/00 |
| | | | | 204/230.7 |
| 2010/0075027 A1* | 3/2010 | Toshima | ............. | C23C 18/1628 |
| | | | | 427/123 |
| 2014/0148006 A1* | 5/2014 | Tanaka | ................ | C23C 18/1675 |
| | | | | 438/660 |
| 2016/0031031 A1* | 2/2016 | Yamakawa | ............ | B23K 3/082 |
| | | | | 427/8 |
| 2017/0226656 A1* | 8/2017 | Dou | .................... | C25D 17/001 |

\* cited by examiner

ELECTROCHEMICAL OR CHEMICAL TREATMENT DEVICE FOR HIGH ASPECT RATIO CIRCUIT BOARD WITH THROUGH HOLE

BACKGROUND OF THE INVENTION

1. Field of the Invention

The present invention relates to an electrochemical or chemical treatment device for high aspect ratio circuit board with through hole that using negative pressure to let the solution flow through the through hole of the circuit board.

2. Description of the Related Art

Nowadays the electronic devices are designed smaller, thinner, and lighter, so the circuit boards are required to be designed with small aperture, high density, multiple layer, and small circuit, since the aperture is smaller and the layer is increased, the aspect ratio of the aperture becomes higher than before; however, as FIG. 1A showing, the conventional electrochemical treatment process can electroplate the circuit board with general aspect ratio (T1/d1) nicely, but as FIG. 1B showing, the conventional electrochemical treatment process is not suitable for the circuit board with high aspect ratio and through hole 41*b* (T2/d2), because the solution cannot reach the middle of the bore of the through hole 41*b*, only the part of the bore that near to the opening is electroplated and forms an electroplated layer 42.

SUMMARY OF THE INVENTION

A primary objective of the present invention is to provide an electrochemical or chemical treatment device for high aspect ratio circuit board with through hole that using negative pressure to let the solution flow through the through hole of the circuit board and to have a better electrochemical treatment efficiency.

To achieve the objective mentioned above, the present invention comprises: an electroplating tank; a solution storage tank; a positioning frame, the positioning frame fixes the circuit board inside the electroplating tank for the electroplating tank to be divided into a solution accumulated area and a suction area by the positioning frame and the circuit board; a priming piping sucking solution from the solution storage tank to the solution accumulated area; a suction cap corresponding to the suction area; and a suction piping connected to the suction cap, using the negative pressure produced by suction to make the solution flow through the through hole of the circuit board, and then sucks the solution back to the solution storage tank.

Also, the priming piping primes the solution into the solution accumulated area of the electroplating tank by a priming pump, the suction piping sucks the solution to make the solution flow through the through hole and transmits the solution back to the solution storage tank by a suction pump, moreover, the electroplating tank has a positioning seat corresponding to the positioning frame.

Whereby when the positioning frame is located inside the electroplating tank, the priming piping begins to prime the solution into the solution accumulated area of the electroplating tank, after the solution has reached the working liquid level, the suction piping sucks the solution by the suction cap and transmits the solution back to the solution storage tank, and then forms a loop system for the through hole of the circuit board to do electrochemical treatment or chemical treatment continuously.

DETAILED DESCRIPTION OF THE PREFERRED EMBODIMENT

Figure 1A:
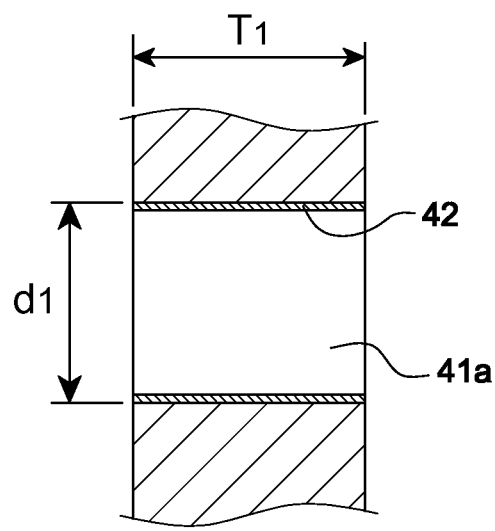
FIG. 1A is a schematic diagram of the result of prior art doing the electrochemical treatment to the normal aspect ratio circuit board with through hole.
Figure 1B:
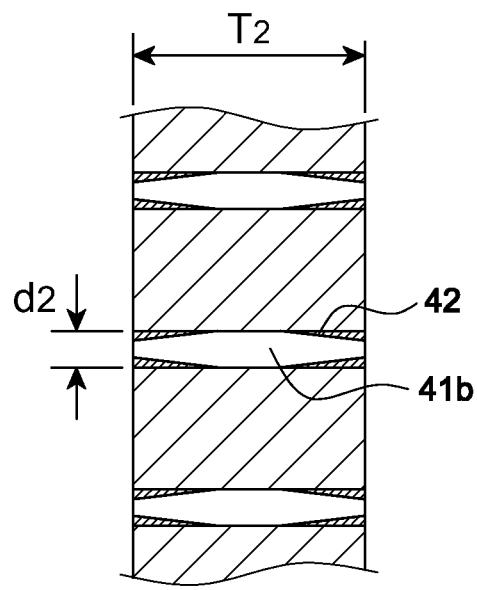
FIG. 1B is a schematic diagram of the result of prior art doing the electrochemical treatment to the high aspect ratio circuit board with through hole.
Figure 2:
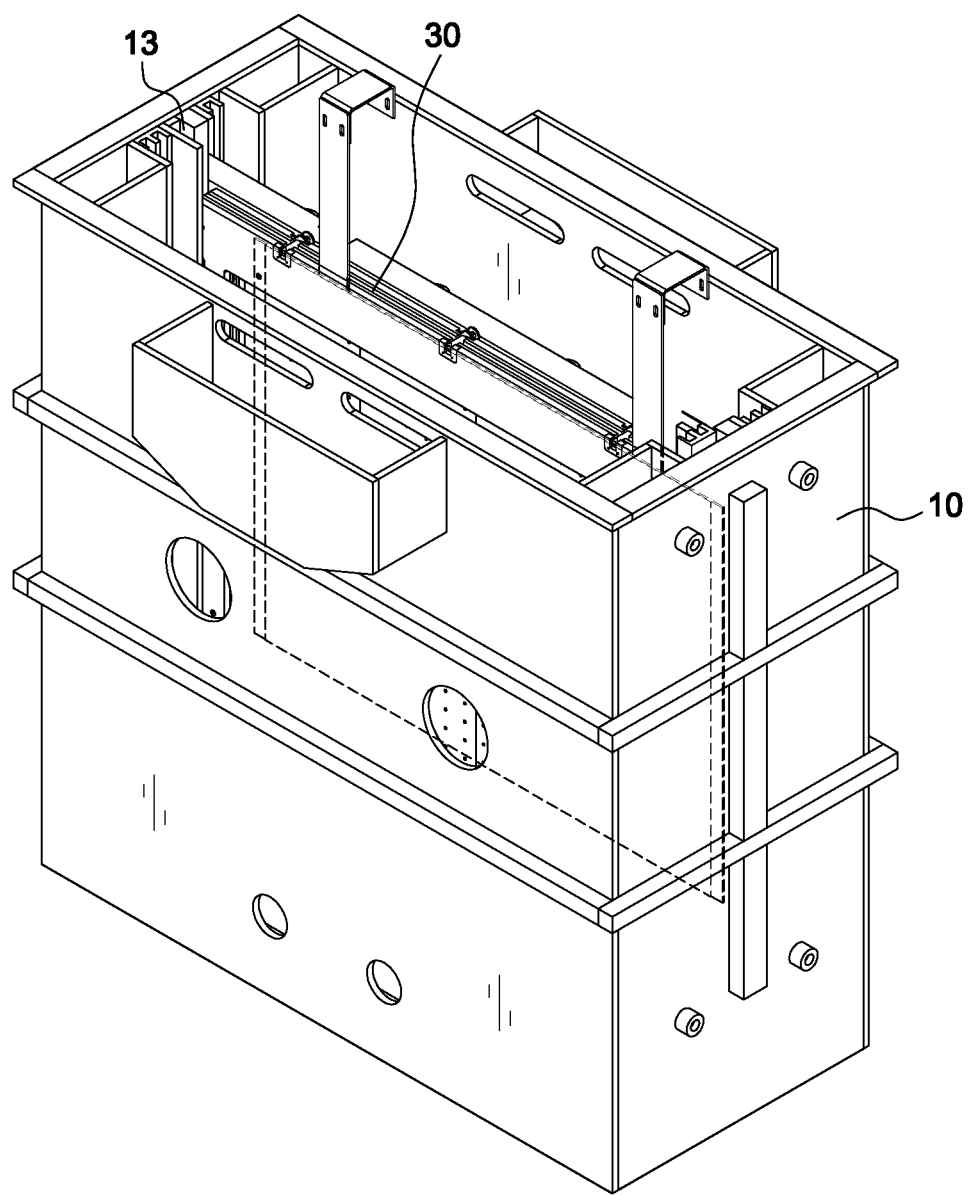
FIG. 2 is a schematic diagram illustrating the main structure of the present invention.
Figure 3:
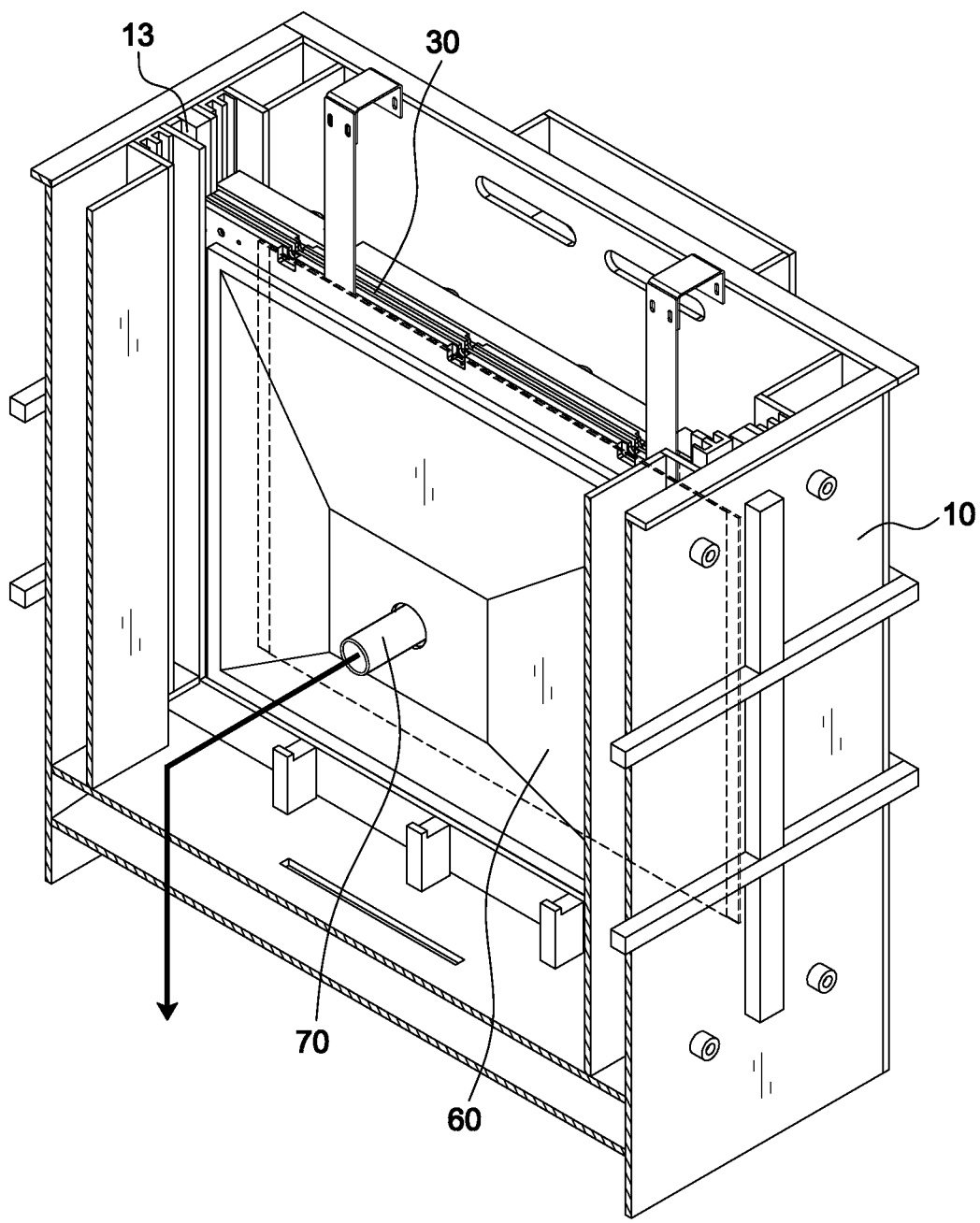
FIG. 3 is a perspective view of part of the present invention.
Figure 4:
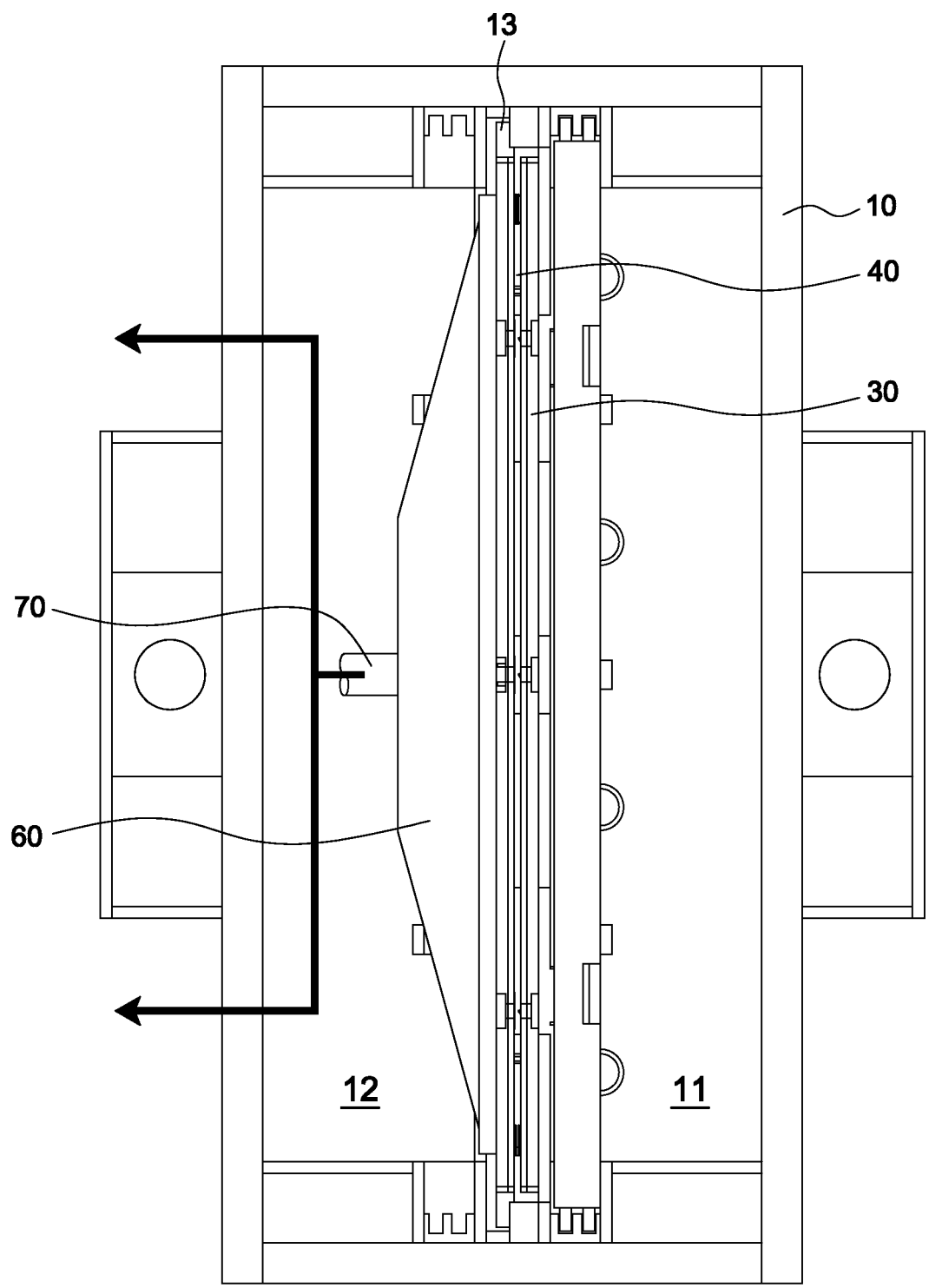
FIG. 4 is a horizontal sectional view of the present invention.
Figure 5:
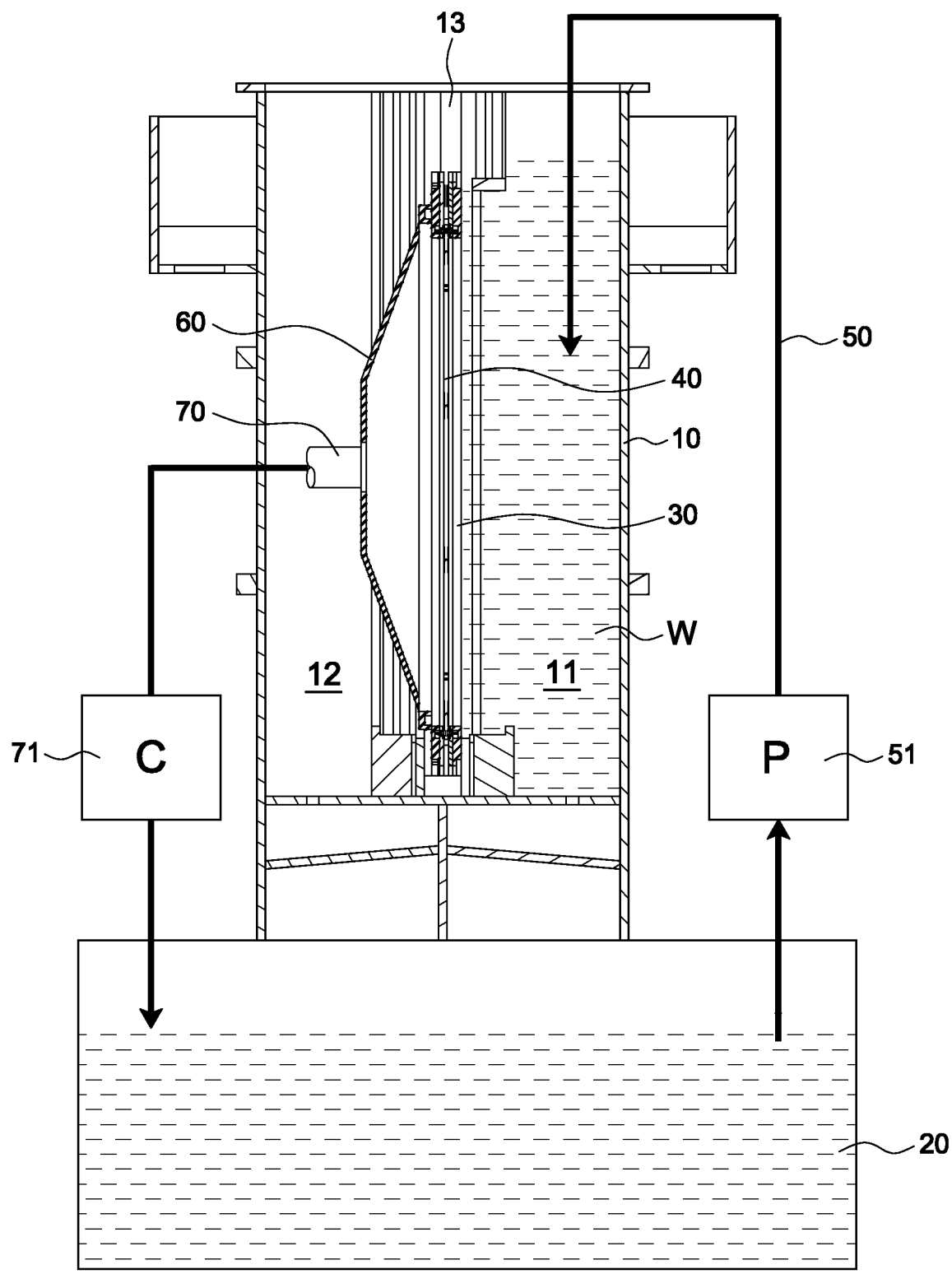
FIG. 5 is a vertical sectional view of the present invention.

Referring to FIGS. 2-5, the present invention comprises: an electroplating tank 10 having a positioning seat arranged inside; a solution storage tank 20; a positioning frame 30, the positioning frame 30 fixes the circuit board inside the electroplating tank 10 for the electroplating tank 10 to be divided into a solution accumulated area 11 and a suction area 12 by the positioning frame 30 and the circuit board 40; a priming pump 51 and a priming piping 50 sucking the solution W from the solution storage tank 20 to the solution accumulated area 11; a suction cap 60 corresponding to the suction area 12; and a suction piping 70 connected to the suction cap 60, using the negative pressure produced by suction to make the solution W flow through the through hole 40 of the circuit board 40, and then sucks the solution W back to the solution storage tank 20.

Figure 6:
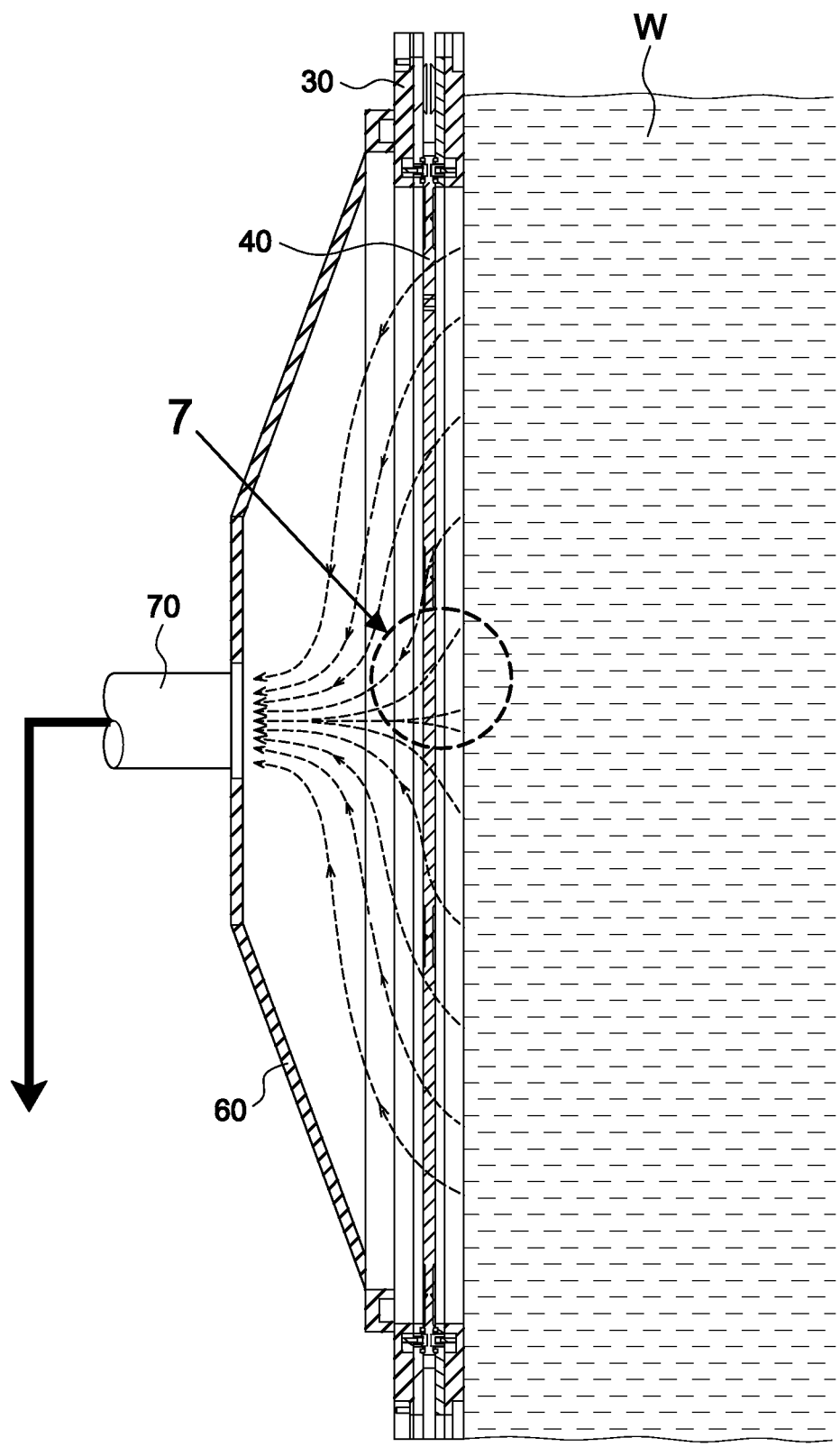
FIG. 6 is a schematic diagram illustrating the sucking process of the present invention.
Figure 7:
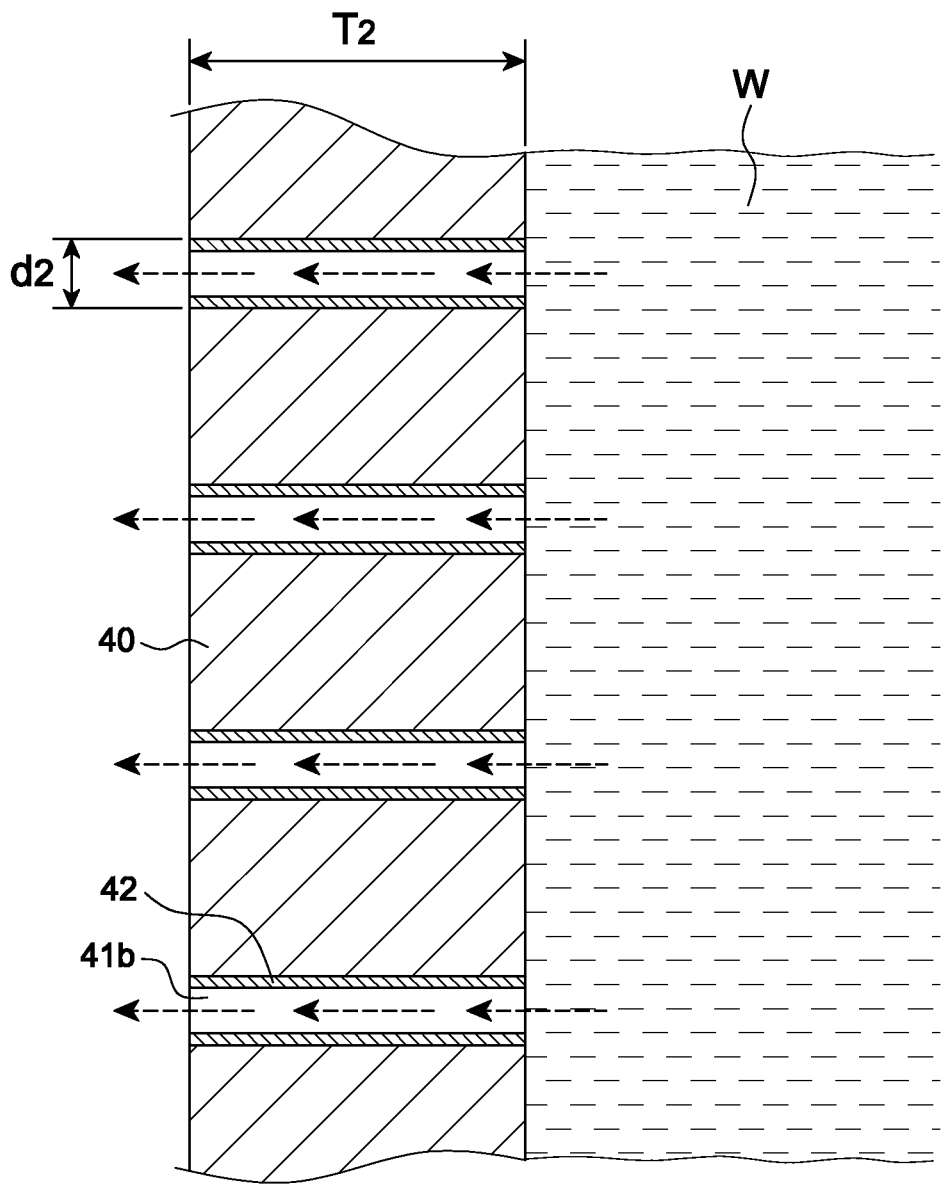
FIG. 7 is a zoom in of the 7 in the FIG. 6.

Referring to FIGS. 6-7, based on the features disclosed above, when the positioning frame 30 and the circuit board 40 is located inside the electroplating tank 10, the priming piping 50 begins to prime the solution W into the solution accumulated area 11 of the electroplating tank 10, after the solution W has reached the working liquid level, the suction piping 70 sucks the solution W by the suction cap 60 and transmits the solution W back to the solution storage tank 20, and then forms a loop system for the through hole 41*b* of the circuit board 40 to do electrochemical treatment or chemical treatment continuously; therefore, the present invention uses negative pressure produced by suction to let the solution W flow through the through hole 41B of the high aspect ratio circuit board, thus, even the aperture d2 of the through hole 41B of the high aspect ratio (T2/d2) circuit board is very long and very narrow, by the drainage effect produced by the suction still can allow the W flow through the through hole 41B; referring to FIG. 7, even the circuit board with very narrow aperture d2 can still form an uniform electroplated layer 42, therefore, by using the drainage effect of the negative pressure produced by suction, the present invention solves the problems in prior art of electroplating a high aspect ratio (T2/d2) circuit board with through hole.

Although particular embodiments of the invention have been described in detail for purposes of illustration, various modifications and enhancements may be made without departing from the spirit and scope of the invention. Accordingly, the invention is not to be limited except as by the appended claims

What is claimed is:

1. An electrochemical or chemical treatment device for high aspect ratio circuit board with through hole, comprising:
   an electroplating tank;
   a solution storage tank;
   a positioning frame, the positioning frame locates the circuit board inside the electroplating tank for the electroplating tank to be divided into a solution accumulated area and a suction area by the positioning frame and the circuit board;
   a priming piping sucking solution from the solution storage tank to the solution accumulated area;
   a suction cap corresponding to the suction area; and
   a suction piping connected to the suction cap, using the negative pressure produced by suction to make the solution flow through the through hole of the circuit board, and then sucks the solution back to the solution storage tank;
   whereby when the positioning frame is located inside the electroplating tank, the priming piping begins to prime the solution into the solution accumulated area of the electroplating tank, after the solution has reached the working liquid level, the suction piping sucks the solution by the suction cap and transmits the solution back to the solution storage tank, and then forms a loop system for the through hole of the circuit board to do electrochemical treatment or chemical treatment continuously.

2. The electrochemical or chemical treatment device for high aspect ratio circuit board with through hole as claimed in claim 1, wherein the priming piping primes the solution into the solution accumulated area of the electroplating tank by a priming pump, the suction piping sucks the solution to make the solution flow through the through hole and transmits the solution back to the solution storage tank by a suction pump.

3. The electrochemical or chemical treatment device for high aspect ratio circuit board with through hole as claimed in claim 2, wherein the electroplating tank has a positioning seat corresponding to the positioning frame.

* * * * *